US006800541B2

(12) United States Patent
Okumura (10) Patent No.: US 6,800,541 B2
(45) Date of Patent: Oct. 5, 2004

(54) PULSE LASER IRRADIATION METHOD FOR FORMING A SEMICONDUCTOR THIN FILM

(75) Inventor: Hiroshi Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 1 day.

(21) Appl. No.: 10/263,771

(22) Filed: Oct. 4, 2002

(65) Prior Publication Data
US 2003/0032222 A1 Feb. 13, 2003

Related U.S. Application Data

(63) Continuation of application No. 09/621,550, filed on Jul. 21, 2000, now abandoned.

(51) Int. Cl.[7] .......................... H01L 21/20; H01L 21/36
(52) U.S. Cl. .................. 438/487; 438/166; 438/365; 438/368; 438/378; 438/482; 438/97; 438/486; 257/74; 257/75; 257/347; 117/4
(58) Field of Search .................. 438/384, 166, 438/482, 486–87, 365, 368, 97; 257/75, 347, 74; 117/4

(56) References Cited

U.S. PATENT DOCUMENTS

| | | | | | |
|---|---|---|---|---|---|
| 5,162,239 | A | * | 11/1992 | Winer et al. .................. 438/22 |
| 5,210,766 | A | * | 5/1993 | Winer et al. .................. 372/40 |
| 5,308,651 | A | * | 5/1994 | Ohta et al. .................. 427/582 |
| 6,002,523 | A | | 12/1999 | Tanaka |
| RE36,760 | E | | 7/2000 | Bloomquist et al. |
| 6,113,689 | A | | 9/2000 | Moon |
| 6,149,988 | A | * | 11/2000 | Shinohara et al. .......... 427/596 |
| 6,174,374 | B1 | * | 1/2001 | Zhang et al. ............... 118/715 |
| 6,187,088 | B1 | | 2/2001 | Okumura |

(List continued on next page.)

FOREIGN PATENT DOCUMENTS

| | | |
|---|---|---|
| JP | A 7-106596 | 4/1995 |
| JP | 7-335586 | 12/1995 |
| JP | 9-246183 | 9/1997 |
| JP | A 10-41244 | 2/1998 |
| JP | A 10-189450 | 7/1998 |
| JP | 11-16850 | 1/1999 |
| JP | A 11-102863 | 4/1999 |

OTHER PUBLICATIONS

Kohno et al. "High performance poly–si tft's fabricated using pulsed laser annealing and remote plasma cvd with low temperature processing" IEEE Trans on Electron Devices, vol. 42, 2/95 p. 251–257.

Giust et al., "Low–temperature polysilicon thin–film transistors fabricated from laser–processed Si film," IEEE Electron Device letters, vol. 19, No. 9 9/98, p. 343–344.

Ong et al., "Threshold energies for the meltig of si and al during pulsed–laser irradiation," Mat. Res. Soc. Symp., vol. 35, 1985, pp. 239–244.

Sinke et al., "Low–energy pulsed–laser irradiation of amorphous silicon melting and resolidification at two fronts," Mat. Res. Soc. Symp., vol. 35, pp. 175–180.

Ryoichi Ishihara et al., "A Novel Double–Pulse Excimer––Laser Crystallization Method of Silicon Thin–Films," Jpn. J. Appl. Phys., v. 34, 1995, pp. 3976–3981.

Roichi Ishihara et al., "Effects of Light Pulse Duration–Laser Crystallization Characteristics of Silicon Thin–Films, " Jpn. J. Appl. Phys., v. 34, 1995, pp. 1759–1764.

Primary Examiner—Matthew Smith
Assistant Examiner—Granvill D. Lee, Jr.
(74) Attorney, Agent, or Firm—Young & Thompson (57) ABSTRACT

A method of irradiation of plural pulse laser beams onto one position of a non-single crystal semiconductor, wherein the pulse laser beams are not higher in energy density than an energy density threshold value necessary for causing a micro-crystallization of the non-single crystal semiconductor.

22 Claims, 11 Drawing Sheets

"tn" : time interval between (n)th pulse irradiation and (n+1)th pulse irradiation

U.S. PATENT DOCUMENTS

| | | |
|---|---|---|
| 6,217,970 B1 | 4/2001 | Arita et al. |
| 6,232,156 B1 | 5/2001 | Ohtani et al. |
| 6,242,291 B1 | 6/2001 | Kusumoto et al. |
| 6,248,606 B1 | 6/2001 | Ino et al. |
| 6,372,039 B1 * | 4/2002 | Okumura et al. ............... 117/8 |
| 6,494,162 B1 * | 12/2002 | Zhang et al. ................... 117/8 |
| 6,613,619 B2 * | 9/2003 | Yamazaki et al. ........... 438/166 |
| 2003/0015133 A1 * | 1/2003 | Zhang et al. ................. 117/84 |

* cited by examiner

FIG. 1

"tn" : time interval between (n)th pulse irradiation and (n+1)th pulse irradiation

PULSE LASER IRRADIATION METHOD FOR FORMING A SEMICONDUCTOR THIN FILM

This application is a continuation of co-pending application Ser. No. 09/621,550, filed on Jul. 21, 2000, now abandoned the entire contents of which are hereby incorporated by reference.

BACKGROUND OF THE INVENTION

The present invention relates to a method of forming a semiconductor thin film, and more particularly to a pulse laser irradiation method for irradiating a pulse laser onto a non-single crystal semiconductor thin film as an active layer of a polysilicon thin film transistor formed over an insulative substrate to apply the same to a liquid crystal display or an image sensor.

In recent years, the manufacturing technique for manufacturing a polysilicon thin film transistor has been applied to form a liquid crystal display with a driver circuit over an inexpensive glass substrate. An excited dimer laser crystallization method is applied to form the polysilicon thin film in view of a reduction in temperature of the process and a high throughput, wherein the excited dimer laser is irradiated onto an amorphous silicon thin film to cause a crystallization of the amorphous silicon thin film, thereby to form a polysilicon thin film.

The excited dimer laser crystallization method is, however, disadvantageous in a limited time for subjecting the amorphous silicon thin film to a heat treatment since the laser beam is a pulse laser beam. The limitation to the time for the heat treatment to the amorphous silicon thin film causes a limitation to size of crystal grains of the polysilicon of the polysilicon thin film. A field effect mobility of carriers of the polysilicon thin film transistor depends on the crystal grain size of the polysilicon thin film of the polysilicon thin film transistor, for which reason the field effect mobility of carriers is limited to about 100 cm2/Vs which is applicable to the liquid crystal display but inapplicable to a high integrated circuit driven by a high frequency such as a dynamic random access memory device.

A first conventional technique to increase the crystal grain size of the polysilicon thin film is disclosed in Japanese laid-open patent publication No. 10-275781 and also disclosed in Japan Applied Physics, 42, p. 694. In accordance with the first conventional technique, plural pulse laser beams are synthesized so that a synthesized laser beam is irradiated onto the amorphous silicon thin film to form the polysilicon thin film.

A second conventional technique to increase the crystal grain size of the polysilicon thin film is disclosed in MRS Bulletin, vol. 21, 1996 March, p. 39. A fine-line laser beam with a beam width of 5 micrometers is scan-irradiated at a pitch of 0.75 micrometers onto island-shaped amorphous silicon film films to form a uniformly grown polysilicon thin film with a almost parallel order of the crystal grain boundaries.

The above first conventional technique is, however, disadvantageous in a difficulty in realizing a uniform increase in crystal grain size over a large area such as a few hundreds millimeters squares for application to the liquid crystal display device.

The above second conventional technique is, however, disadvantageous in a drop of throughput and in requiring a complicated carrying system to realize a sub-micron stage positioning accuracy.

In the above circumstances, it had been required to develop a novel pulse laser anneal process for forming a non-single crystal semiconductor thin film free from the above problem.

SUMMARY OF THE INVENTION

Accordingly, it is an object of the present invention to provide a novel pulse laser anneal process for forming a non-single crystal semiconductor thin film free from the above problems.

It is a further object of the present invention to provide a novel pulse laser anneal process for forming a non-single crystal semiconductor thin film, which allows an increased throughput.

It is a still further object of the present invention to provide a novel pulse laser anneal process for forming a non-single crystal semiconductor thin film having a uniformly large crystal grain size over a large area.

It is yet a further object of the present invention to provide a novel pulse laser anneal process for forming a non-single crystal semniconductor thin film having a uniformly high carrier mobility over a large area.

The present invention provides a method of irradiation of plural pulse laser beams onto one position of a non-single crystal semiconductor, wherein the pulse laser beams are not higher in energy density than an energy density threshold value necessary for causing a micro-crystallization of the non-single crystal semiconductor.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a method of irradiation of plural pulse laser beams onto one position of a non-single crystal semiconductor, wherein the pulse laser beams are not higher in energy density than an energy density threshold value necessary for causing a micro-crystallization of the non-single crystal semiconductor.

It is preferable that at least one set of different plural pulse laser beams having different energy densities is irradiated onto the one position of the non-single crystal semiconductor, and all of the different energy densities are lower than the energy density threshold value.

It is further preferable that first one of the different plural pulse laser beams making one set is highest in energy density than others of the different plural pulse laser beams.

It is further more preferable that a total of the different energy densities of the different plural pulse laser beams making one set is not higher than the energy density threshold value.

It is moreover preferable that a total of the different energy densities of the different plural pulse laser beams making one set is not higher than the energy density threshold value.

It is also preferable that a total of energy densities of the plural pulse laser beams irradiated onto the one position of the non-single crystal semiconductor is not higher than the energy density threshold value.

It is also preferable that the plural pulse laser beams are irradiated so that a time-interval between irradiations of sequential two of the pulse laser beams is not more than six times of an averaged pulse width of the sequential two of the pulse laser beams.

It is further preferable that the plural pulse laser beams have a uniform pulse width, and the plural pulse laser beams are irradiated with a time-interval which is not more than six times of the pulse width.

It is further more preferable that the plural pulse laser beams are irradiated with a time-interval which is in the range of one time to six times of the pulse width.

It is also preferable that a canning of irradiation of the plural pulse laser beams is made in a longitudinal axis direction and with a pitch which is not larger than an averaged longitudinal axis size of crystal grains in the longitudinal axis direction.

The second present invention provides a method of causing a crystallization of a non-single crystal semiconductor by irradiation of plural pulse laser beams onto one position of the non-single crystal semiconductor, wherein the pulse laser beams are not higher in energy density than an energy density threshold value necessary for causing a micro-crystallization of the non-single crystal semiconductor film.

It is preferable that at least one set of different plural pulse laser beams having different energy densities is irradiated onto the one position of the non-single crystal semiconductor, and all of the different energy densities are lower than the energy density threshold value.

It is further preferable that first one of the different plural pulse laser beams making one set is highest in energy density than others of the different plural pulse laser beams.

It is further more preferable that a total of the different energy densities of the different plural pulse laser beams making one set is not higher than the energy density threshold value.

It is also preferable that a total of the different energy densities of the different plural pulse laser beams making one set is not higher than the energy density threshold value.

It is also preferable that a total of energy densities of the plural pulse laser beams irradiated onto the one position of the non-single crystal semiconductor is not higher than the energy density threshold value.

It is also preferable that the plural pulse laser beams are irradiated so that a time-interval between irradiations of sequential two of the pulse laser beams is not more than six times of an averaged pulse width of the sequential two of the pulse laser beams.

It is further preferable that the plural pulse laser beams have a uniform pulse width, and the plural pulse laser beams are irradiated with a time-interval which is not more than six times of the pulse width.

It is further more preferable that the plural pulse laser beams are irradiated with a time-interval which is in the range of one time to six times of the pulse width.

It is also preferable that a canning of irradiation of the plural pulse laser beams is made in a longitudinal axis direction and with a pitch which is not larger than an averaged longitudinal axis size of crystal grains in the longitudinal axis direction.

The third present invention provides a method of forming a semiconductor thin film including crystal grains which has a longitudinal axis size which is larger than two times of a short axis size thereof by irradiation of plural pulse laser beams onto one position of a non-single crystal semiconductor film, wherein the pulse laser beams are not higher in energy density than an energy density threshold value necessary for causing a micro-crystallization of the non-single crystal semiconductor film.

It is preferable that at least one set of different plural pulse laser beams having different energy densities is irradiated onto the one position of the non-single crystal semiconductor film, and all of the different energy densities are lower than the energy density threshold value.

It is further preferable that first one of the different plural pulse laser beams making one set is highest in energy density than others of the different plural pulse laser beams.

It is further more preferable that a total of the different energy densities of the different plural pulse laser beams making one set is not higher than the energy density threshold value.

It is also preferable that a total of the different energy densities of the different plural pulse laser beams making one set is not higher than the energy density threshold value.

It is also preferable that a total of energy densities of the plural pulse laser beams irradiated onto the one position of the non-single crystal semiconductor film is not higher than the energy density threshold value.

It is also preferable that the plural pulse laser beams are irradiated so that a time-interval between irradiations of sequential two of the pulse laser beams is not more than six times of an averaged pulse width of the sequential two of the pulse laser beams.

It is further preferable that the plural pulse laser beams have a uniform pulse width, and the plural pulse laser beams are irradiated with a time-interval which is not more than six times of the pulse width.

It is further more preferable that the plural pulse laser beams are irradiated with a time-interval which is in the range of one time to six times of the pulse width.

It is also preferable that a canning of irradiation of the plural pulse laser beams is made in a longitudinal axis direction and with a pitch which is not larger than an averaged longitudinal axis size of crystal grains in the longitudinal axis direction.

PREFERRED EMBODIMENT

Figure 3A:
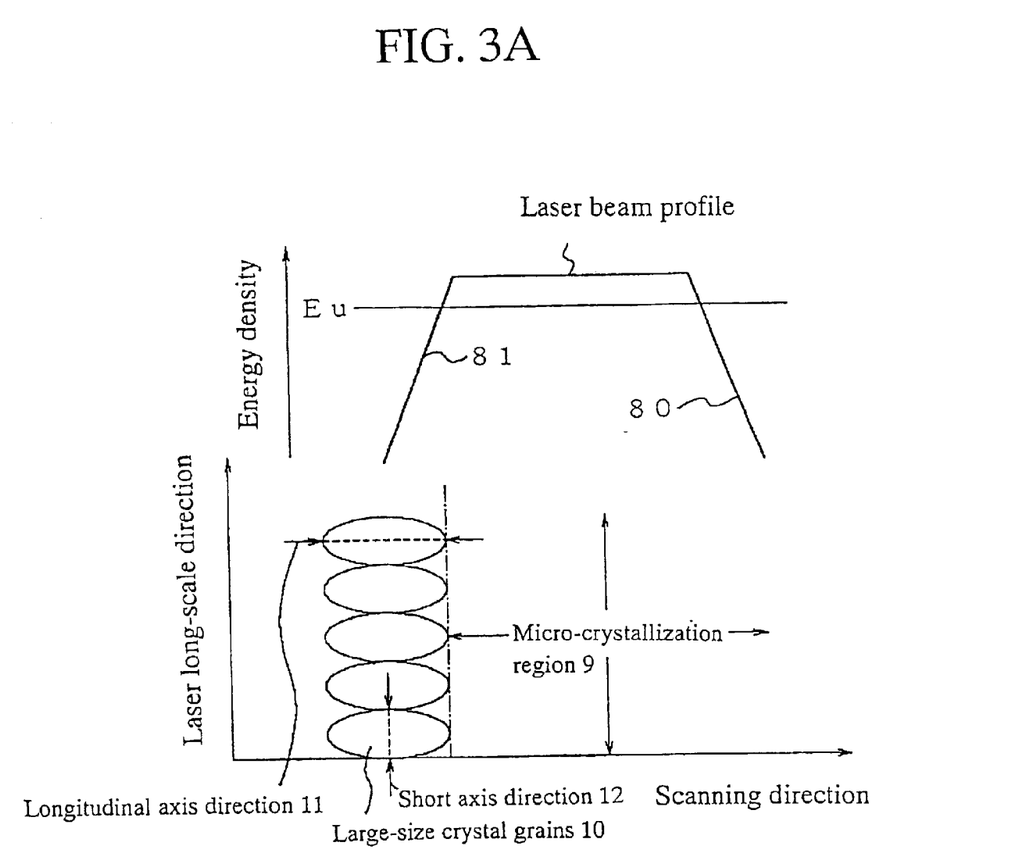
FIG. 3A is a diagram illustrative of a crystallization mechanism of amorphous silicon thin film upon irradiation of a double pulse laser beam irradiation.

A first embodiment according to the present invention will be described in detail with reference to the drawings. Before a novel pulse laser anneal process for forming a non-single crystal semiconductor thin film will be described, a phenomenon of crystallization is described. FIG. 3A is a diagram illustrative of a crystallization mechanism of amorphous silicon thin film upon irradiation of a double pulse laser beam irradiation. The non-single crystal silicon thin film includes any silicon film free of single crystal structure, for example, the amorphous silicon thin film and the poly-silicon thin film. A micro-crystallization of the non-single crystal silicon thin film is caused by change in crystal core generation mechanism, wherein a non-uniform crystal core generation mechanism with a crystal core generation site on an interface of the thin film to the substrate is changed to a uniform crystal core generation mechanism. The change of the crystal core generation mechanism depends upon a transition temperature and a cooling rate.

A long-scale line laser beam is irradiated onto the non-single crystal silicon thin film, wherein the long-scale line laser beam has a profile in energy density over a micro-crystallization threshold value Eu shown in FIG. 3A. A former portion 80 of the laser beam profile shows a proportional increase in the energy density up to over the micro-crystallization threshold value Eu. An intermediate portion of the laser beam profile remains constant over the micro-crystallization threshold value Eu. A latter portion 81 of the laser beam profile shows a proportional decrease in the energy density down to under the micro-crystallization threshold value Eu. Large size crystal grains are formed where the energy density of the laser beam is equal to the micro-crystallization threshold value Eu. A micro-crystallization region 9 corresponds to a region where the energy density of the laser beam profile is over the micro-crystallization threshold value Eu. The large size crystal grains are formed positions adjacent to the micro-crystallization region 9. If the laser beam with the beam profile which is over the micro-crystallization threshold value Eu is irradiated onto the non-crystal silicon thin film, then it is possible to control the crystal grain size and the generation site of the crystal grains The large size crystal grains 10 are formed by the later portion 81 of the laser beam profile. If the large size crystal grains 10 are used as seeds of the crystal grains and the laser beam canning is made under those grain size, then the seeds of the crystal grains are continuously grown. Large size crystal grains are also formed by the former portion 80 of the laser beam profile. The polycrystal structure including the large size crystal grains shows the micro-crystallization by the subsequent scanning irradiation of the laser beam without disturbance to the growth of the seed crystals formed by the later portion 81 of the laser beam profile. Namely, utilization of the micro-crystallization phenomenon makes it possible to prevent non-uniformity of the crystal structure.

In order to obtain a high throughput, it is necessary to enlarge the crystal grain size of the seed crystals formed by the later portion 81 of the laser beam profile. In order to enlarge the crystal grain size of the seed crystals, a double pulse method is effective which irradiates plural pulse laser beams synchronizing with each other continuously within a time which is almost equal to a pulse width onto the same site. During when the non-single crystal silicon thin film is melt by an irradiation of a first irradiated pulse laser, a second irradiated pulse laser is irradiated onto the non-single crystal silicon thin film, so that a time when the non-single crystal silicon thin film is melt is prolonged or extended to reduce a solidification rate, whereby the crystal grain size is enlarged.

Figure 1:
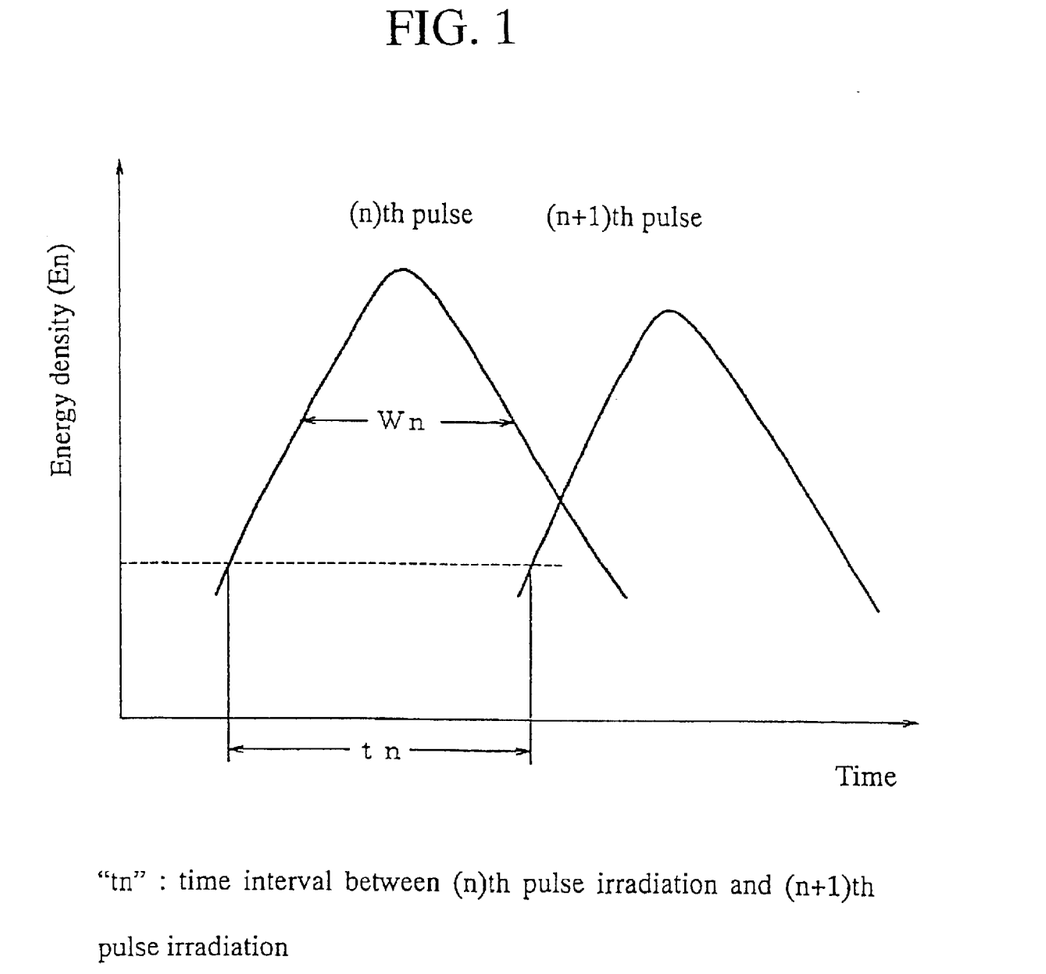
FIG. 1 is a diagram illustrative of adjacent two of pulse profiles in energy density irradiated sequentially in accordance with the novel pulse irradiation method in accordance with the present invention.

FIG. 1 is a diagram illustrative of adjacent two of pulse profiles in energy density irradiated sequentially in accordance with the novel pulse irradiation method in accordance with the present invention. A pulse n-th irradiated has an energy density $E_n$ and a pulse width $W_n$. A next pulse (n+1)-th irradiated has an energy density $E_{n+1}$ and a pulse width $W_{n+1}$. A time-interval between the n-th irradiation of the pulse and the (n+1)-th irradiation of the pulse is "tn", where "n" is the natural number. The threshold value of the micro-crystallization of the non-single crystal silicon is "Eu". A pulse laser canning irradiation is carried out under the conditions that $Eu>E_n \geq E_{n+1}$, $tn \leq 6W_n$, $E_1+E_2+ - - - +E_n+E_{n+1}>Eu$ to form a semiconductor thin film having uniformly large-sized crystal grains distributed over a large area and also having a uniformly high carrier mobility over the large area.

Figure 2:
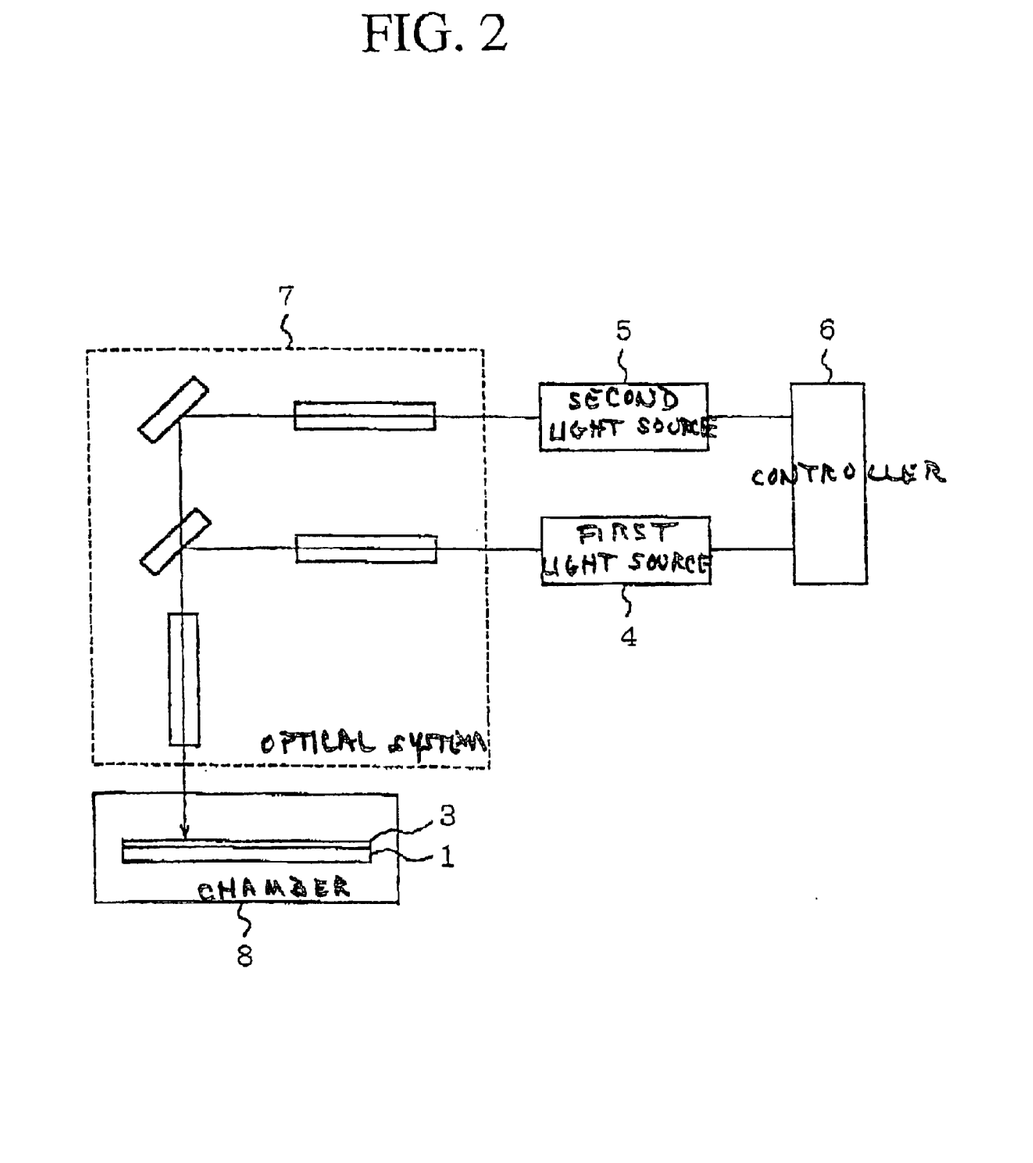
FIG. 2 is a block diagram illustrative of a laser beam irradiation system for irradiating pulse laser beams in accordance with the novel pulse irradiation method in accordance with the present invention.

FIG. 2 is a block diagram illustrative of a laser beam irradiation system for irradiating pulse laser beams in accordance with the novel pulse irradiation method in accordance with the present invention. The laser beam irradiation system comprises first and second light sources 4 and 5, a controller 6 connected to the first and second light sources 4 and 5 for controlling the first and second light sources 4 and 5, an optical system 7 and a chamber 8. A glass substrate 1 with an amorphous silicon thin film 3 is placed in the chamber 8. The double pulse beams are emitted from the first and second light sources 4 and 5 and transmitted through the optical system 7, so that the double pulse beams synchronizing with each other are continuously irradiated within a time which is almost equal to a pulse width onto the same site. During when the non-single crystal silicon thin film is melt by an irradiation of the first irradiated pulse laser, a second irradiated pulse laser is irradiated onto the non-single crystal silicon thin film, so that a time when the non-single crystal silicon thin film is melt is prolonged or extended to reduce a solidification rate, whereby the crystal grain size is enlarged.

Figure 5:
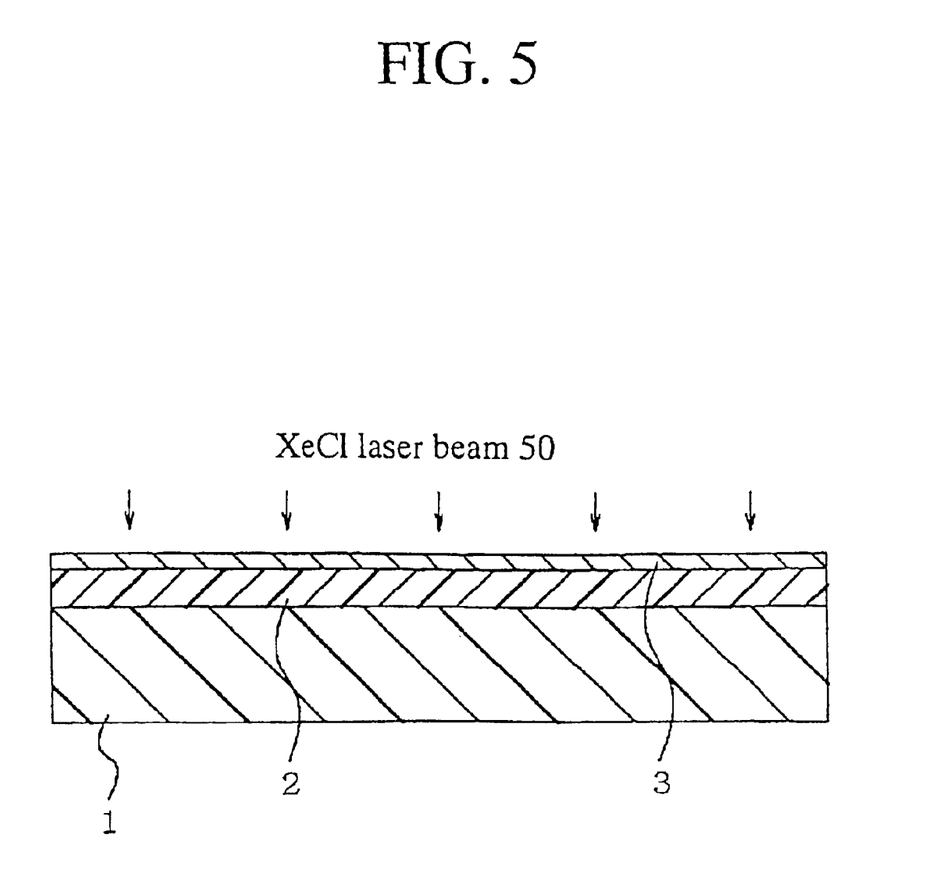
FIG. 5 is a fragmentary cross sectional elevation view illustrative of a substrate receiving a double pulse laser irradiation in accordance with the present invention.

FIG. 5 is a fragmentary cross sectional elevation view illustrative of a substrate receiving a double pulse laser irradiation in accordance with the present invention. A silicon oxide film 2 having a thickness of 200 nanometers is deposited on a glass substrate 1 by a plasma enhanced chemical vapor deposition method. An amorphous silicon thin film 3 having a thickness of 50 nanometers is deposited on the silicon oxide film 2 by a low pressure chemical vapor deposition method. The amorphous silicon thin film 3 may alternatively be deposited by other deposition methods such as a plasma enhanced chemical vapor deposition method or a sputtering method. An XeCl laser beam 50 is irradiated onto the amorphous silicon thin film 3. The XeCl laser beam 50 has a dimension of 100 millimeters and 10–20 micrometers. The XeCl laser beam 50 has a wavelength of 308 nanometers. The XeCl laser beam 50 has a pulse width (W1) of 50 nanoseconds. The micro-crystallization threshold value (Eu) is 470 mJ/cm2. The double pulse irradiation is made onto the amorphous silicon thin film 3 by use of the system of FIG. 2 under the conditions that a first laser beam has a first energy density (E1) of 400 mJ/cm2 and a second laser beam has a second energy density (E2) of 240 mJ/cm2, and an irradiation interval (t1) between the first and second laser beams is 100 nanoseconds so that the irradiation interval (t1) is made equal to double of the pulse width (W1).

Figure 3B:
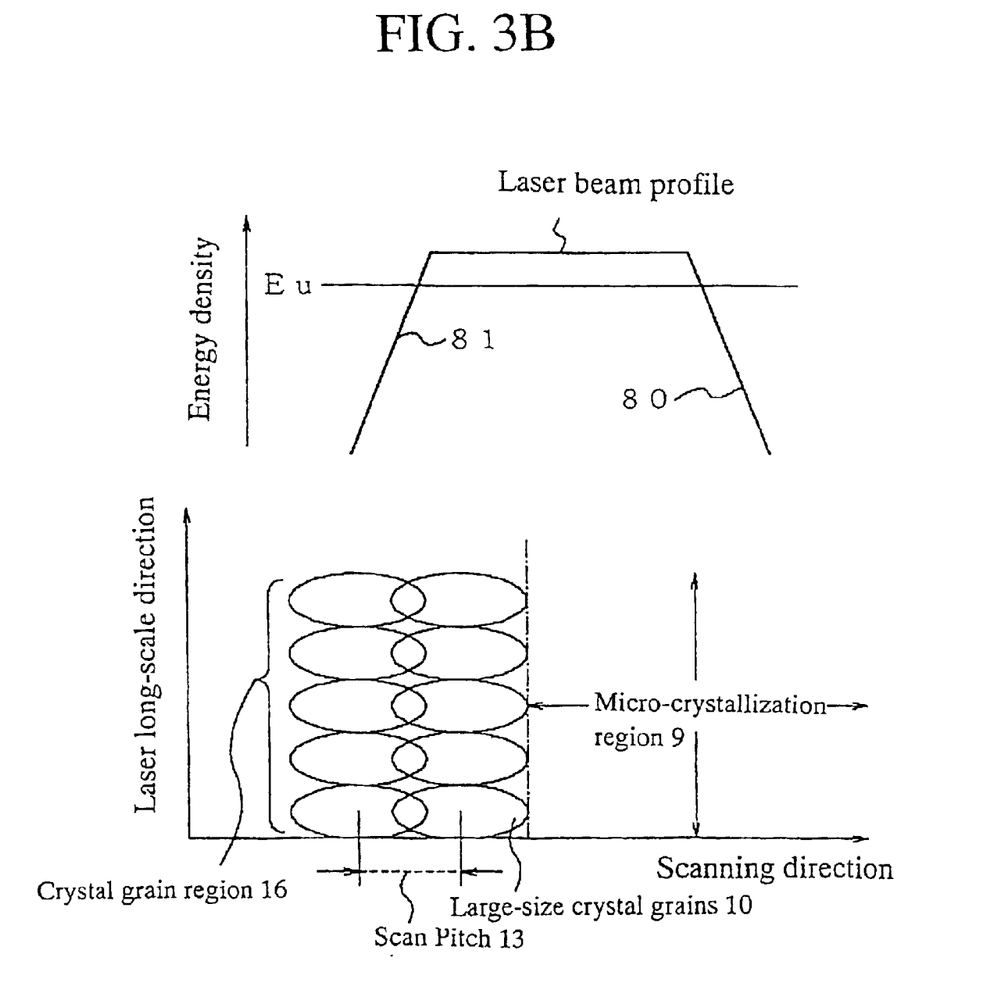
FIG. 3B is a diagram illustrative of a continuous crystal growth mechanism of non-single crystal silicon thin film upon irradiation of a double pulse laser beam irradiation.

FIG. 3B is a diagram illustrative of a continuous crystal growth mechanism of non-single crystal silicon thin film upon irradiation of a double pulse laser beam irradiation. As shown in FIG. 3A, the double pulse irradiation forms anisotropic elliptically-shaped large-sized crystal grains 10 bounded to the micro-crystallization region 9. The anisotropic elliptically-shaped large-sized crystal grains 10 has a longitudinal axis size of 2.8 micrometers in a longitudinal axis direction 11 and a short axis size of 1.2 micrometers in a short axis direction 12. The scan irradiation is made with a scan pitch 13 which is lower than 2.0 micrometers as the size of the anisotropic elliptically-shaped large-sized crystal grains 10 to obtain a continuously grown crystal grain region 16 as shown in FIG. 3B. The stage positioning accuracy is necessary to be within 0.7 micrometers in consideration of the crystal grain size and the pulse irradiation pitch.

Figure 3C:
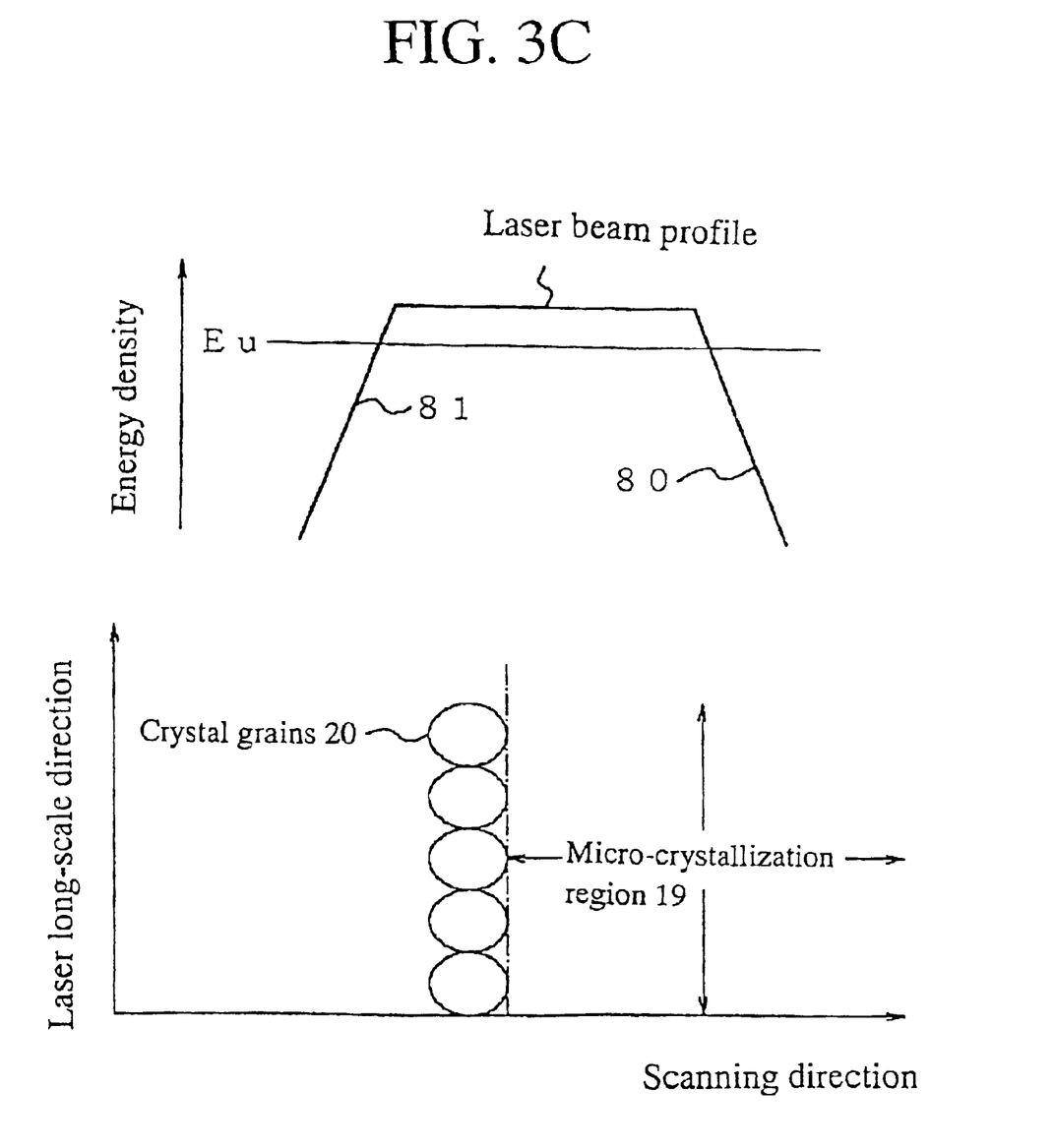
FIG. 3C is a diagram illustrative of a continuous crystal growth mechanism of non-single crystal silicon thin film upon irradiation of a single pulse laser beam irradiation.

A comparative example to the above present invention will be described. FIG. 3C is a diagram illustrative of a continuous crystal growth mechanism of non-single crystal silicon thin film upon irradiation of a single pulse laser beam irradiation, A single laser beam irradiation of 500 mJ/cm2 is made, thereby to form crystal grains 20 with a grain size of 0.8 micrometers with almost isotropy at a boundary to the micro-crystallization region. In order to cause a continuous growth of the crystal grains, it is necessary that the scan pitch is suppressed to be not more than 0.6 micrometers, whereby it is difficult to obtain a high throughput. It is also required that the accuracy in positioning the stage is not more than 0.2 micrometers. It is, therefore, actually difficult to obtain a continuous and stable growth of the crystal grains over entire regions receiving the laser irradiation.

Figure 4A:
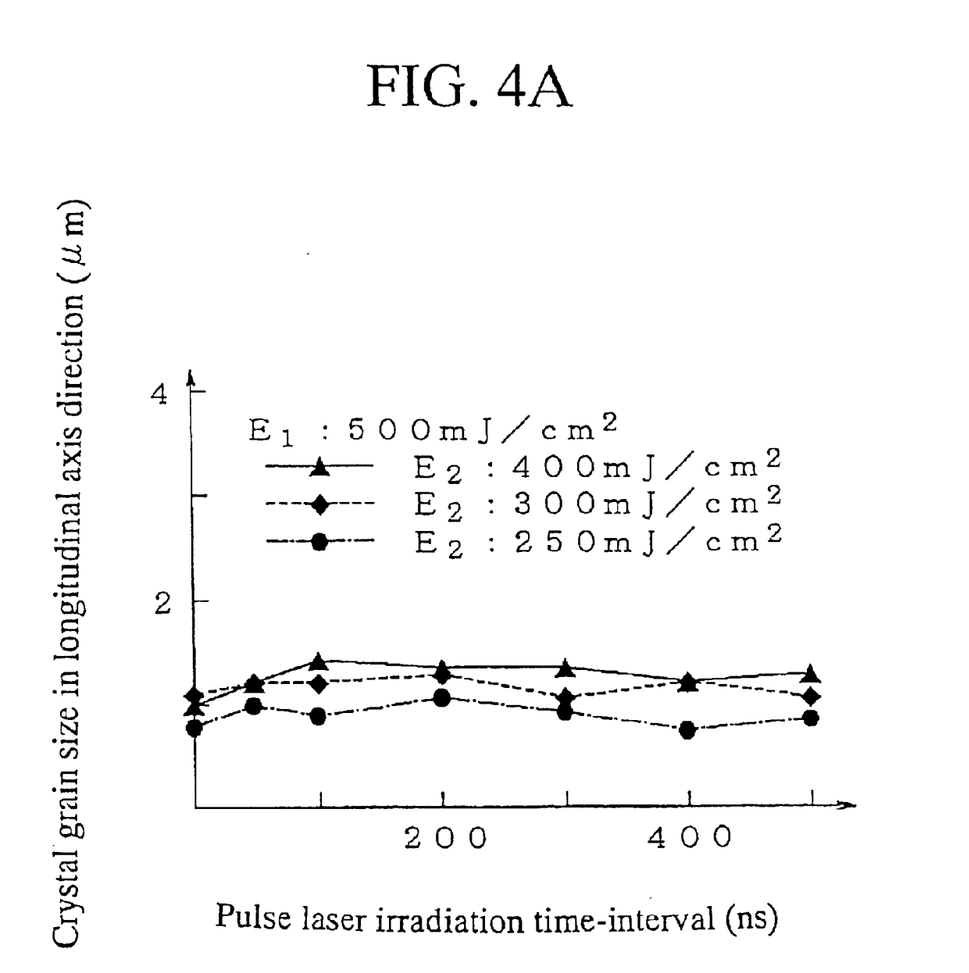
FIG. 4A is a diagram illustrative of variations in size of the anisotropic-shaped large-sized crystal grains in a longitudinal direction over pulse laser intervals when a double pulse laser beam irradiation is made in accordance with the present invention, wherein first one of adjacent two pluses in the double pulse laser beam irradiation has a first energy density E1 of 500 mJ/cm2 whilst second one of the adjacent two pluses irradiated following to the first one has second energy densities E2 of 250 mJ/cm2, 300 mJ/cm2 and 400 mJ/cm2.

FIG. 4A is a diagram illustrative of variations in size of the anisotropic-shaped large-sized crystal grains in a longitudinal direction over pulse laser irradiation time-intervals when a double pulse laser beam irradiation is made in accordance with the present invention, wherein first one of adjacent two pluses in the double pulse laser beam irradiation has a first energy density E1 of 500 mJ/cm2 whilst second one of the adjacent two pluses irradiated following to the first one has second energy densities E2 of 250 mJ/cm2, 300 mJ/cm2 and 400 mJ/cm2. As described above, the micro-crystallization threshold value (Eu) is 470 mJ/cm2. The energy density E1 of the first one of the adjacent two pluses in the double pulse laser beam irradiation is above the micro-crystallization threshold value (Eu) of 470 mJ/cm2. Every when the second energy density E2 of the second one of the adjacent two pluses irradiated following to the first one is 250 mJ/cm2, 300 mJ/cm2 and 400 mJ/cm2, the crystal grain size in the longitudinal direction is small, for example, about 1 micrometer over the intervals of the pulse laser irradiation. It is difficult to obtain the effect of enlargement of the crystal grains. The irradiation of the first one with the high energy density E1 over 470 mJ/cm2 of the adjacent two pluses in the double pulse laser beam irradiation causes that the temperature of the interface region of the non-single crystal silicon layer to the insulative substrate is sufficiently high for excessive suppression to generation of the crystal seeds.

Figure 4B:
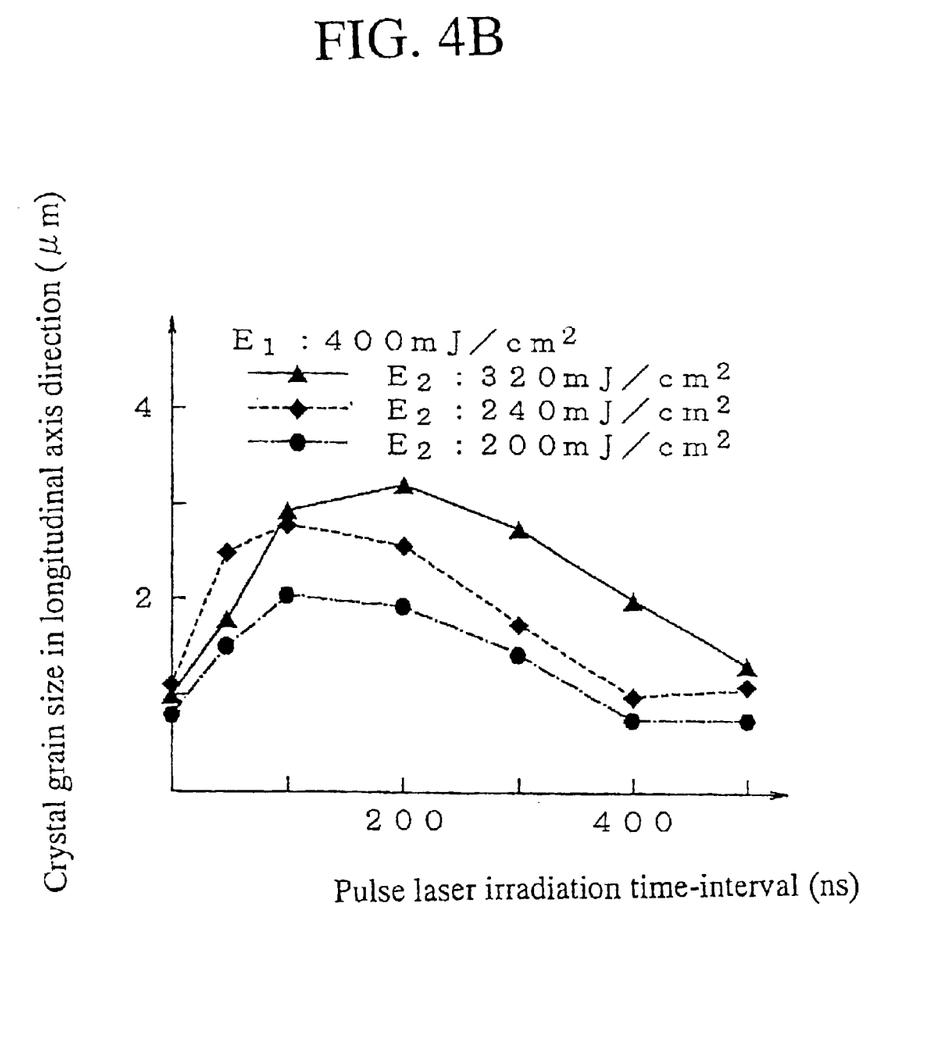
FIG. 4B is a diagram illustrative of variations in size of the anisotropic-shaped large-sized crystal grains in a longitudinal direction over pulse laser intervals when a double pulse laser beam irradiation is made in accordance with the present invention, wherein first one of adjacent two pluses in the double pulse laser beam irradiation has a first energy density E1 of 400 mJ/cm2 whilst second one of the adjacent two pluses irradiated following to the first one has second energy densities E2 of 200 mJ/cm2, 240 mJ/cm2 and 320 mJ/cm2.

FIG. 4B is a diagram illustrative of variations in size of the anisotropic-shaped large-sized crystal grains in a longitudinal direction over pulse laser irradiation time-intervals when a double pulse laser beam irradiation is made in accordance with the present invention, wherein first one of adjacent two pluses in the double pulse laser beam irradiation has a first energy density E1 of 400 mJ/cm2 whilst second one of the adjacent two pluses irradiated following to the first one has second energy densities E2 of 200 mJ/cm2, 240 mJ/cm2 and 320 mJ/cm2. As described above, the micro-crystallization threshold value (Eu) is 470 mJ/cm2. The energy density E1 of the first one of the adjacent two pluses in the double pulse laser beam irradiation is below the micro-crystallization threshold value (Eu) of 470 mJ/cm2. Every when the second energy density E2 of the second one of the adjacent two pluses irradiated following to the first one is 200 mJ/cm2, 240 mJ/cm2 and 320 mJ/cm2, the crystal grain size in the longitudinal direction is increased in the range of the time-intervals of the pulse laser irradiation from 50 nanoseconds to 300 nanoseconds. If the second energy density E2 of the second one of the adjacent two pluses irradiated following to the first one is 320 mJ/cm2, the crystal grain size is larger than when the second energy density E2 is 200 mJ/cm2 or 240 mJ/cm2. If the second energy density E2 of the second one of the adjacent two pluses irradiated following to the first one is 240 mJ/cm2, the crystal grain size is larger than when the second energy density E2 is 200 mJ/cm2. Accordingly, it is preferable for increasing the crystal grain size that both the first and second energy densities E1 and E2 are lower than the micro-crystallization threshold value (Eu) of 470 mJ/cm2. Namely, if both the first and second energy densities E1 and E2 are lower than the micro-crystallization threshold value (Eu) of 470 mJ/cm2, then it is possible to obtain the large effect of enlargement of the crystal grains. The irradiation of the first one with the high energy density E1 under 470 mJ/cm2 of the adjacent two pluses in the double pulse laser beam irradiation causes that the temperature of the interface region of the non-single crystal silicon layer to the insulative substrate is so low as preventing the excessive suppression to generation of the crystal seeds.

Figure 4C:
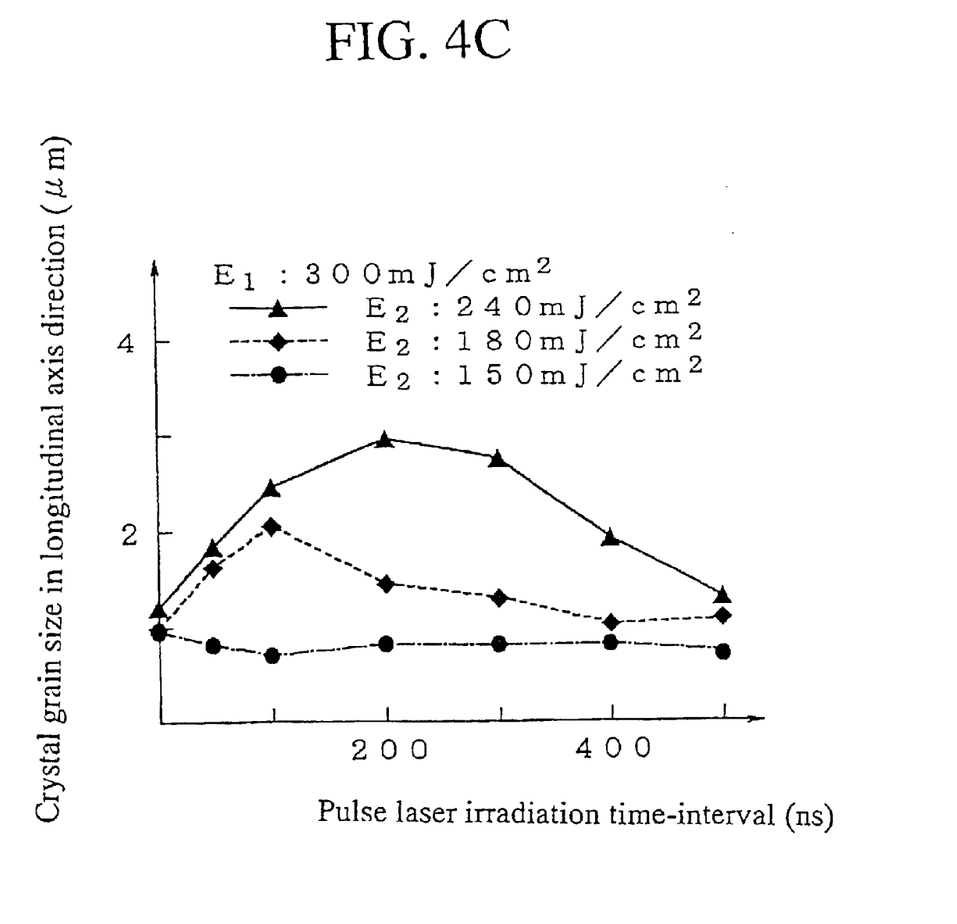
FIG. 4C is a diagram illustrative of variations in size of the anisotropic-shaped large-sized crystal grains in a longitudinal direction over pulse laser intervals when a double pulse laser beam irradiation is made in accordance with the present invention, wherein first one of adjacent two pluses in the double pulse laser beam irradiation has a first energy density E1 of 300 mJ/cm2 whilst second one of the adjacent two pluses irradiated following to the first one has second energy densities E2 of 150 mJ/cm2, 180 mJ/cm2 and 240 mJ/cm2.

FIG. 4C is a diagram illustrative of variations in size of the anisotropic-shaped large-sized crystal grains in a longitudinal direction over pulse laser irradiation time-intervals when a double pulse laser beam irradiation is made in accordance with the present invention, wherein first one of adjacent two pluses in the double pulse laser beam irradiation has a first energy density E1 of 300 mJ/cm2 whilst second one of the adjacent two pluses irradiated following to the first one has second energy densities E2 of 150 mJ/cm2, 180 mJ/cm2 and 240 mJ/cm2. As described above, the micro-crystallization threshold value (Eu) is 470 mJ/cm2. The energy density E1 of the first one of the adjacent two pluses in the double pulse laser beam irradiation is below the micro-crystallization threshold value (Eu) of 470 mJ/cm2. When the second energy density E2 of the second one of the adjacent two pluses irradiated following to the first one is 240 mJ/cm2, the crystal grain size in the longitudinal direction is increased in the range of the intervals of the pulse laser irradiation from 50 nanoseconds to 400 nanoseconds. Namely, if the total of the first and second energy densities E1+E2 is more than the micro-crystallization threshold value (Eu) of 470 mJ/cm2, then a certain increase in the size of the crystal grain in the longitudinal direction is obtained. If the second energy density E2 of the second one of the adjacent two pluses irradiated following to the first one is 180 mJ/cm2, the crystal grain size is increased as much as the second energy density E2 is 240 mJ/cm2 but only in the range of the interval of the pulse laser irradiation from 50–100 nanoseconds but is lower in the longer interval of over 200 nanoseconds than when the second energy density E2 is 240 mJ/cm2. Namely, if the total of the first and second energy densities E1+E2 is more than the micro-crystallization threshold value (Eu) of 470 mJ/cm2, then a certain increase in the size of the crystal grain in the longitudinal direction is obtained. If the second energy density E2 of the second one of the adjacent two pluses irradiated following to the first one is 150 mJ/cm2, the crystal grain size is not increased in the entire range of the interval of the pulse laser irradiation. Namely, if the total of the first and second energy densities E1+E2 is less than the micro-crystallization threshold value (Eu) of 470 mJ/cm2, then no increase in the size of the crystal grain in the longitudinal direction is obtained. Accordingly, it is preferable for increasing the crystal grain size not only that both the first and second energy densities E1 and E2 are lower than the micro-crystallization threshold value (Eu) of 470 mJ/cm2, but also that the total value of the first and second energy densities E1+E2 of the first and second ones of the adjacent two pluses in the double pulse laser beam irradiation is not less than the micro-crystallization threshold value (Eu) of 470 mJ/cm2. Namely, if both the first and second energy densities E1 and E2 are lower than the micro-crystallization threshold value (Eu) of 470 mJ/cm2 and further that the total value of the first and second energy densities E1+E2 of the first and second ones of the adjacent two pluses in the double pulse laser beam irradiation is not less than the micro-crystallization threshold value (Eu) of 470 mJ/cm2, then it is possible to obtain the large effect of enlargement of the crystal grains. The irradiation of the first one with the high energy density E1 under 470 mJ/cm2 of the adjacent two pluses in the double pulse laser beam irradiation causes that the temperature of the interface region of the non-single crystal silicon layer to the insulative substrate is so low as preventing the excessive suppression to generation of the crystal seeds. If the total value of the first and second energy densities E1+E2 of the first and second ones of the adjacent two pluses in the double pulse laser beam irradiation is less than the micro-crystallization threshold value (Eu) of 470 mJ/cm2, then no micro-crystallization nor continuous growth of the crystal grains is caused, and further it is insufficient for enlargement of the crystal grain size that an upper region of the amorphous silicon thin film is melt.

Figure 6:
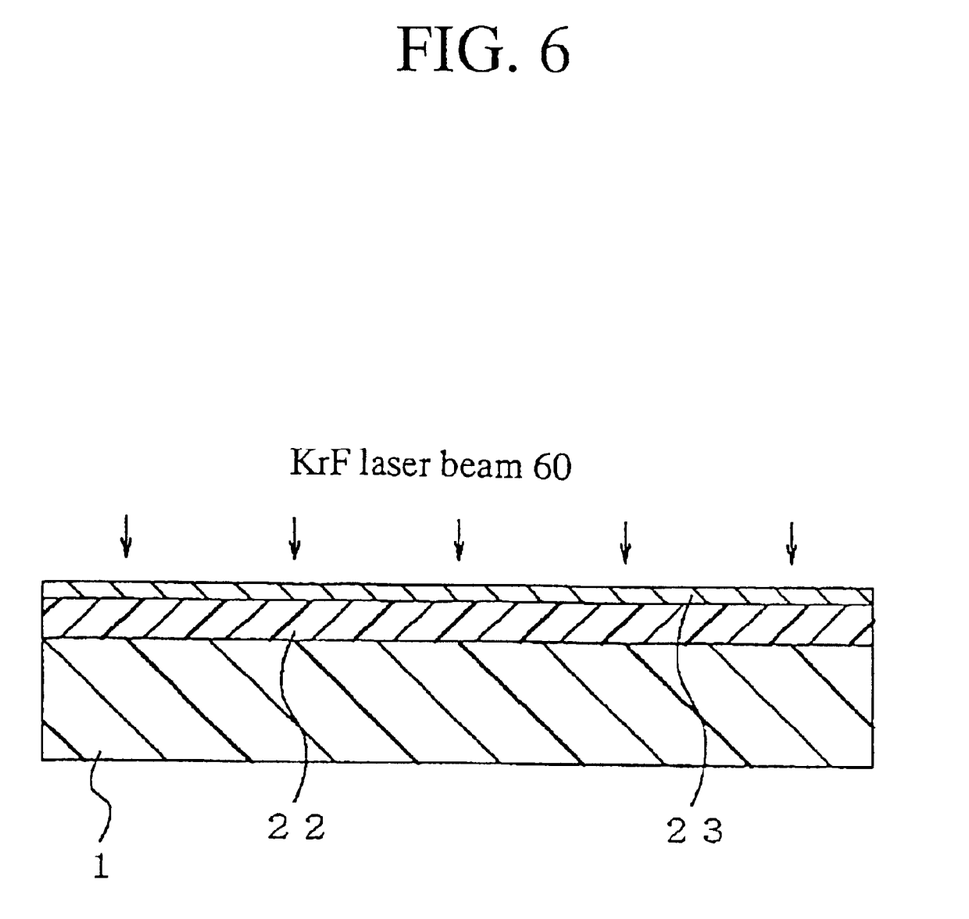
FIG. 6 is a fragmentary cross sectional elevation view illustrative of a substrate receiving a double pulse laser irradiation in accordance with a first modified embodiment of the present invention.

FIG. 6 is a fragmentary cross sectional elevation view illustrative of a substrate receiving a double pulse laser irradiation in accordance with a first modified embodiment of the present invention. A silicon oxide film 22 having a thickness of 100 nanometers is deposited on a glass substrate 1 by a plasma enhanced chemical vapor deposition method. An amorphous silicon thin film 23 having a thickness of 75 nanometers is deposited on the silicon oxide film 22 by a low pressure chemical vapor deposition method. The amorphous silicon thin film 23 may alternatively be deposited by other deposition methods such as a plasma enhanced chemical vapor deposition method or a sputtering method. A KrF laser beam 60 is irradiated onto the amorphous silicon thin film 23. The KrF laser beam 60 has a wavelength of 380 nanometers. The KrF laser beam 60 has a first pulse width (W1) of 38 nanoseconds and a second pulse width (W2) of 38 nanoseconds. The micro-crystallization threshold value (Eu) is 500 mJ/cm2. The triple pulse irradiation is made onto the amorphous silicon thin film 23 under the conditions that a first laser beam has a first energy density (E1) of 380 mJ/cm2, a second laser beam has a second energy density (E2) of 260 mJ/cm2 and a third laser beam has a third energy density (E3) of 200 mnJ/cm2, and a first irradiation interval (t1) between the first and second laser beam irradiations is 80 nanoseconds and a second irradiation interval (t2) between the second and third laser beam irradiations is 50 nanoseconds so that the first irradiation interval (t1) is made equal to 2.1 times of the pulse width (W1) (t1=2.1W1), and that the second irradiation interval (t2) is made equal to 1.3 times of the pulse width (W2) (t2=1.3W2).

The triple pulse irradiation forms anisotropic elliptically-shaped large-sized crystal grains bounded to the micro-crystallization region. The anisotropic elliptically-shaped large-sized crystal grains has a longitudinal axis size of 3.3 micrometers in a longitudinal axis direction and a short axis size of 1.4 micrometers in a short axis direction. The scan irradiation is made with a scan pitch which is lower than 3.3 micrometers as the size of the anisotropic elliptically-shaped large-sized crystal grains to obtain a continuously grown crystal grain region. The stage positioning accuracy is decided in consideration of the crystal grain size and the pulse irradiation pitch.

Figure 7:
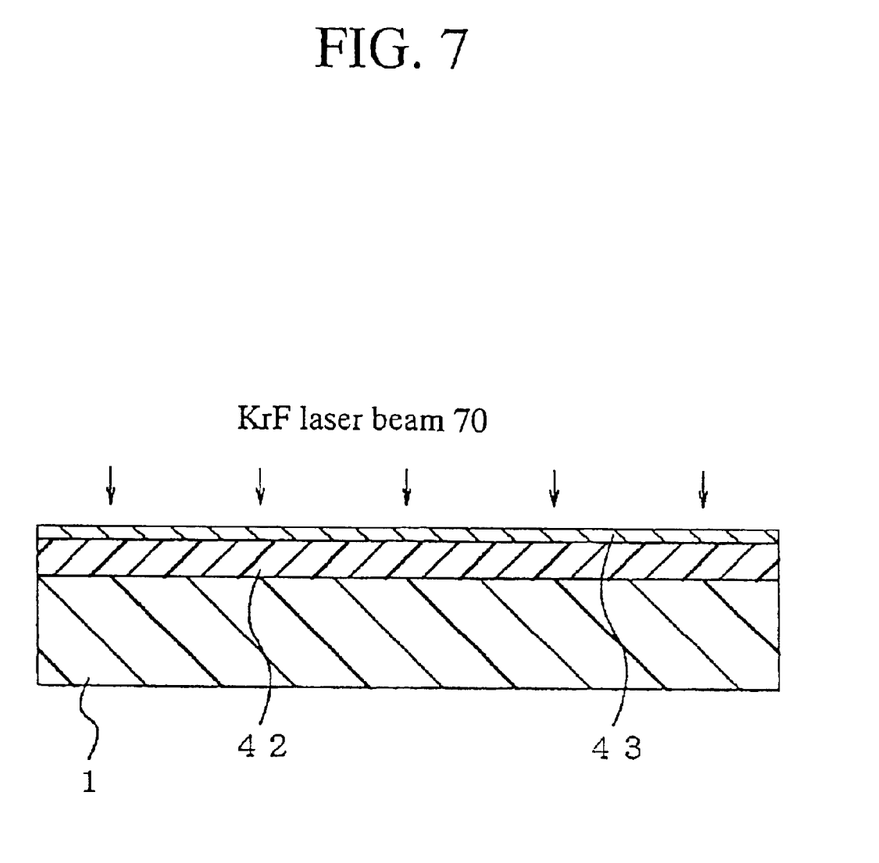
FIG. 7 is a fragmentary cross sectional elevation view illustrative of a substrate receiving a double pulse laser irradiation in accordance with a second modified embodiment of the present invention.

FIG. 7 is a fragmentary cross sectional elevation view illustrative of a substrate receiving a double pulse laser irradiation in accordance with a second modified embodiment of the present invention. A silicon oxide film 42 having a thickness of 100 nanometers is deposited on a glass substrate 1 by a plasma enhanced chemical vapor deposition method. An amorphous silicon thin film 43 having a thickness of 50 nanometers is deposited on the silicon oxide film 42 by a plasma enhanced chemical vapor deposition method. The amorphous silicon thin film 43 may alternatively be deposited by other deposition methods such as a plasma enhanced chemical vapor deposition method or a sputtering method. A KrF laser beam 70 is irradiated onto the amorphous silicon thin film 43. The KrF laser beam 70 has a wavelength of 248 nanometers. The KrF laser beam 70 has a pulse width (W1) of 38 nanoseconds. The micro-crystallization threshold value (Eu) is 460 mJ/cm2. The double pulse irradiation is made onto the amorphous silicon thin film 43 under the conditions that a first laser beam has a first energy density (E1) of 350 mJ/cm2, and a second laser beam has a second energy density (E2) of 200 mJ/cm2, and a first irradiation interval (t1) between the first and second laser beam irradiations is 60 nanoseconds so that the first irradiation interval (t1) is made equal to 1.6 times of the pulse width (W1) (t1=1.6W1).

The double pulse irradiation forms anisotropic elliptically-shaped large-sized crystal grains bounded to the micro-crystallization region. The anisotropic elliptically-shaped large-sized crystal grains has a longitudinal axis size of 2.5 micrometers in a longitudinal axis direction and a short axis size of 1.2 micrometers in a short axis direction. The scan irradiation is made with a scan pitch which is lower than 2.5 micrometers as the size of the anisotropic elliptically-shaped large-sized crystal grains to obtain a continuously grown crystal grain region. The stage positioning accuracy is decided in consideration of the crystal grain size and the pulse irradiation pitch.

It is preferable that the interval "tn" of the pulse laser beams irradiations satisfies the relationship of tn≦6Wn, wherein the "Wn" is the pulse width of the pulse laser beams. It is more preferable that the interval "tn" of the pulse laser beams irradiations satisfies the relationship of Wn ≦tn≦4Wn, wherein the "Wn" is the pulse width of the pulse laser beams.

The plural pulse laser irradiations onto the amorphous silicon thin film, which satisfy the above requirements, form the anisotropic elliptically-shaped large-sized crystal grains, wherein a longitudinal axis size in a longitudinal axis direction is larger by not less than two times than a short axis size in a short axis direction. This makes it possible to carry out the laser beam scanning irradiation with a large pitch over a wide or large area thereby obtaining an increased high throughput.

Further, the necessary accuracy in positioning the stage is not so high. This makes it possible to reduce the manufacturing cost for the laser beam irradiation system.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of causing a crystallization of a non-single crystal semiconductor by irradiation of plural pulse laser beams onto one position of said non-single crystal semiconductor, wherein said pulse laser beams are not higher in energy density than an energy density threshold value necessary for causing a micro-crystallization of said non-single crystal semiconductor film and wherein at least one set of different plural pulse laser beams having different energy densities is irradiated onto said one position of said non-single crystal semiconductor, and all of said different energy densities are lower than said energy density threshold value.

2. The method as claimed in claim 1, wherein first one of said different plural pulse laser beams making one set is highest in energy density than others of said different plural pulse laser beams.

3. The method as claimed in claim 2, wherein a total of said different energy densities of said different plural pulse laser beams making one set is higher than said energy density threshold.

4. The method as claimed in claim 1, wherein a total of said different energy densities of said different plural pulse laser beams making one set is higher than said energy density threshold value.

5. The method as claimed in claim 1, wherein during when said non-single crystal silicon thin film is melt by an irradiation of a first irradiated pulse laser, a second irradiated pulse laser is irradiated onto said non-single crystal silicon thin film.

6. A method of causing a crystallization of a non-single crystal semiconductor by irradiation of plural pulse laser beams onto one position of said non-single crystal semiconductor, wherein said pulse laser beams are not higher in energy density than an energy density threshold value necessary for causing a micro-crystallization of said non-single crystal semiconductor film and wherein a total of energy densities of said plural pulse laser beams irradiated onto said one position of said non-single crystal semiconductor is higher than said energy density threshold value.

7. A method of causing a crystallization of a non-single crystal semiconductor by irradiation of plural pulse laser beams onto one position of said non-single crystal semiconductor, wherein said pulse laser beams are not higher in energy density than an energy density threshold value necessary for causing a micro-crystallization of said non-single crystal semiconductor film and wherein said plural pulse laser beams are irradiated so that an interval between sequential two of said pulse laser beams is not more than six times of an averaged pulse width of said sequential two of said pulse laser beams.

8. The method as claimed in claim 7, wherein said plural pulse laser beams have a uniform pulse width, and said plural pulse laser beams are irradiated with an interval which is not more than six times of said pulse width.

9. The method as claimed in claim 8, wherein said plural pulse laser beams are irradiate with an interval which as in the range of one time to six times of said pulse width.

10. A method of causing a crystallization of a non-single crystal semiconductor by irradiation of plural pulse laser beams onto one position of said non-single crystal semiconductor, wherein said pulse laser beams are not higher in energy density than an energy density threshold value necessary for causing a micro-crystallization of said non-single crystal semiconductor film, wherein a scanning of irradiation of said plural pulse laser beams is made in a longitudinal axis direction and with a pitch which is not larger than an averaged longitudinal axis size of crystal grains in said longitudinal axis direction.

11. The method as claimed in claim 10, wherein during when said non-single crystal silicon thin film is melt by an irradiation of a first irradiated pulse laser, a second irradiated pulse laser is irradiated onto said non-single crystal silicon thin film.

12. A method of forming a semiconductor thin film including crystal grains which have a longitudinal axis size which is larger than two times of a short axis size thereof, said method including the steps of:

forming a non-single crystal semiconductor film on a substrate; and irradiating plural pulse laser beams onto one position of said non-single crystal semiconductor film, wherein said pulse laser beams are not higher in energy density than an energy density threshold value necessary for causing a micro-crystallization of said non-single crystal semiconductor film.

13. The method as claimed in claim 12, wherein at least one set of different plural pulse laser beams having different energy densities is irradiated onto said one position of said non-single crystal semiconductor film, and all of said different energy densities are lower than said energy density threshold value.

14. The method as claimed in claim 13, wherein first one of said different plural pulse laser beams making one set is highest in energy density than others of said different plural pulse laser beams.

15. The method as claimed in claim 14, wherein a total of said different energy densities of said different plural pulse laser beams making one set is higher than said energy density threshold value.

16. The method as claimed in claim 13, wherein a total of said different energy densities of said different plural pulse laser beams making one set is higher than said energy density threshold value.

17. The method as claimed in claim 12, wherein a total of energy densities of said plural pulse laser beams irradiated onto said one position of said non-single crystal semiconductor film is higher than said energy density threshold value.

18. The method as claimed in claim 12, wherein said plural pulse laser beams are irradiated so that an interval between sequential two of said pulse laser beams is not more than six times of an averaged pulse width of said sequential two of said pulse laser beams.

19. The method as claimed in claim 18, wherein plural pulse laser beams have a uniform pulse width, and said plural pulse laser beams are irradiated with an interval which is not more than six times of said pulse width.

20. The method as claimed in claim 19, wherein said plural pulse laser beams are irradiated with an interval which is in the range of one time to six times of said pulse width.

21. The method as claimed in claim 12, wherein a scanning of irradiation of said plural pulse laser beams is made in a longitudinal axis direction and with a pitch which is not larger than an averaged longitudinal axis size of crystal grains in said longitudinal axis direction.

22. The method as claimed in claim 12, wherein during when said non-single crystal silicon thin film is melt by an irradiation of a first irradiated pulse laser, a second irradiated pulse laser is irradiated onto said non-single crystal silicon thin film.

* * * * *